(12) United States Patent
Zhang

(10) Patent No.: US 11,063,398 B2
(45) Date of Patent: Jul. 13, 2021

(54) HUB

(71) Applicant: C-SMARTLINK INFORMATION TECHNOLOGY CO., LIMITED, Shenzhen (CN)

(72) Inventor: Wenfeng Zhang, Shenzhen (CN)

(73) Assignee: C-SMARTLINK INFORMATION TECHNOLOGY CO., LIMITED, Shenzhen (CN)

( * ) Notice: Subject to any disclaimer, the term of this patent is extended or adjusted under 35 U.S.C. 154(b) by 0 days.

(21) Appl. No.: 16/709,938

(22) Filed: Dec. 11, 2019

(65) Prior Publication Data

US 2021/0167564 A1 Jun. 3, 2021

(30) Foreign Application Priority Data

Dec. 2, 2019 (CN) .......................... 201911214236.4

(51) Int. Cl.
| | |
|---|---|
| *H01R 27/02* | (2006.01) |
| *H05K 5/02* | (2006.01) |
| *H05K 1/18* | (2006.01) |
| *H01R 12/75* | (2011.01) |

(52) U.S. Cl.
CPC ............ *H01R 27/02* (2013.01); *H01R 12/75* (2013.01); *H05K 1/18* (2013.01); *H05K 5/0247* (2013.01); *H01R 2201/06* (2013.01); *H05K 2201/10098* (2013.01); *H05K 2201/10189* (2013.01); *H05K 2201/10356* (2013.01); *H05K 2201/10522* (2013.01)

(58) Field of Classification Search
CPC ..................................................... H01R 27/02
See application file for complete search history.

(56) References Cited

U.S. PATENT DOCUMENTS

| | | | |
|---|---|---|---|
| 2008/0166905 A1* | 7/2008 | Murphy ............... | H01R 13/504 439/188 |
| 2010/0081377 A1* | 4/2010 | Chatterjee ............ | G06F 1/1632 455/41.1 |

* cited by examiner

*Primary Examiner* — Jerry Wu

(57) ABSTRACT

A hub device includes a first member including a first housing and a first circuit board arranged within the first housing, the first circuit board comprising a wireless emitting module; and a second member detachably connected to the first member and including a second housing and a second circuit board arranged within the second housing. The second circuit board includes a wireless receiving module that is used to wirelessly communicate with the wireless emitting module.

14 Claims, 4 Drawing Sheets

HUB

CROSS REFERENCE TO RELATED APPLICATIONS

This application claims priority to Chinese Patent Application No. 201911214236.4, filed Dec. 2, 2019, which are hereby incorporated by reference herein as if set forth in its entirety.

BACKGROUND

1. Technical Field

The present disclosure generally relates to hubs, and particularly to a hub having a first member and a second member that are detachably connected to each other.

2. Description of Related Art

Hubs that connect peripheral devices to a host (e.g., a computer) via cables are known. The length of the cables is an important factor. Long cables allow the hubs to be put at a place that is far away from the host. However, long cables take up more space and are not convenient to carry.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
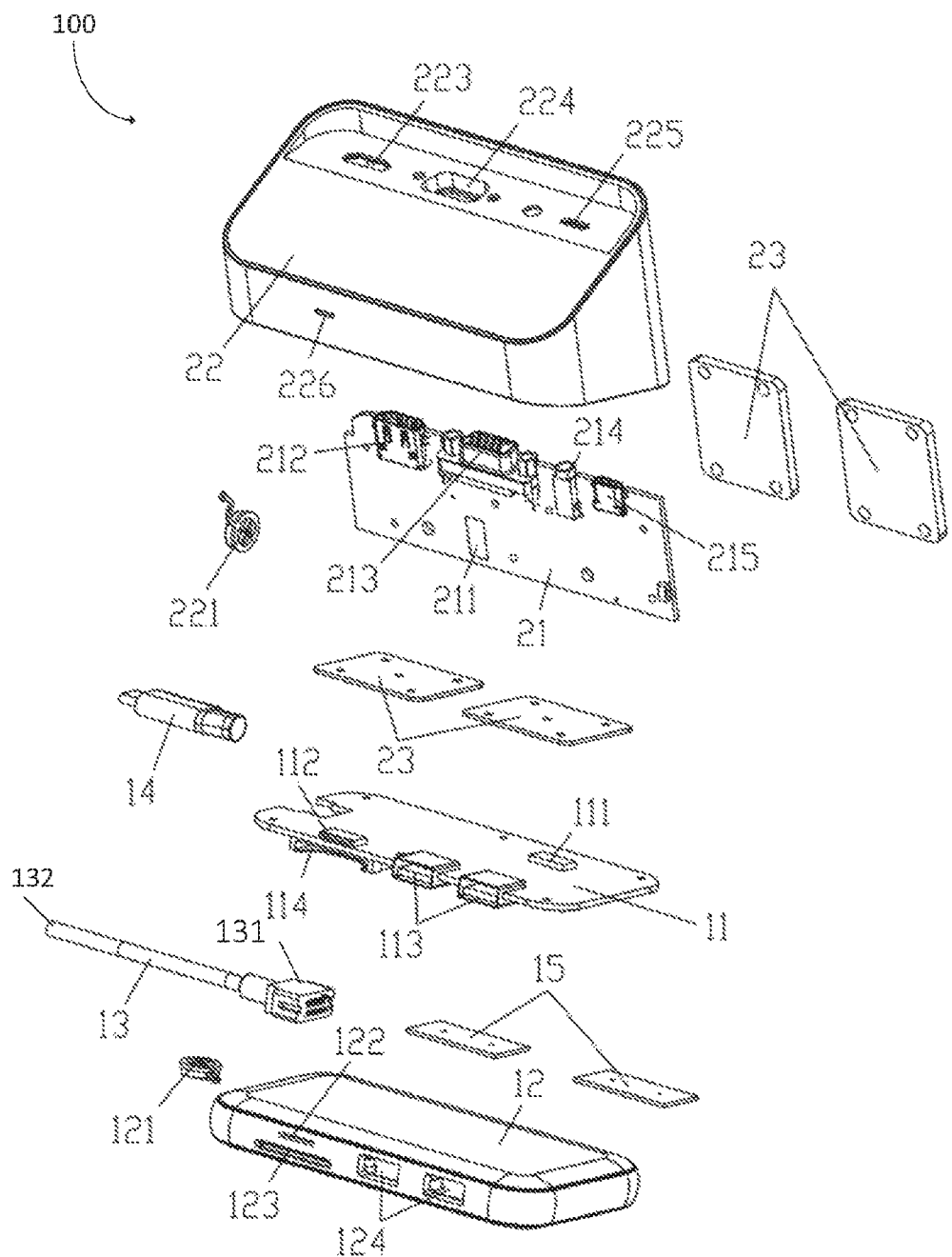
FIG. 1 is an isometric exploded view of a hub according to an embodiment.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

The terms "upper", "lower", "left" and "right", indicating the orientational or positional relationship based on the orientational or positional relationship shown in the drawings, are merely for convenience of description, but are not intended to indicate or imply that the device or elements must have a particular orientation or be constructed and operated in a particular orientation, and therefore should not be construed as limiting the present invention. The terms "first" and "second" are used for descriptive purposes only and are not to be construed as indicating or implying relative importance or implicitly indicating the number of technical features. The meaning of "multiple" is two or more, unless expressly stated otherwise.

Figure 2:
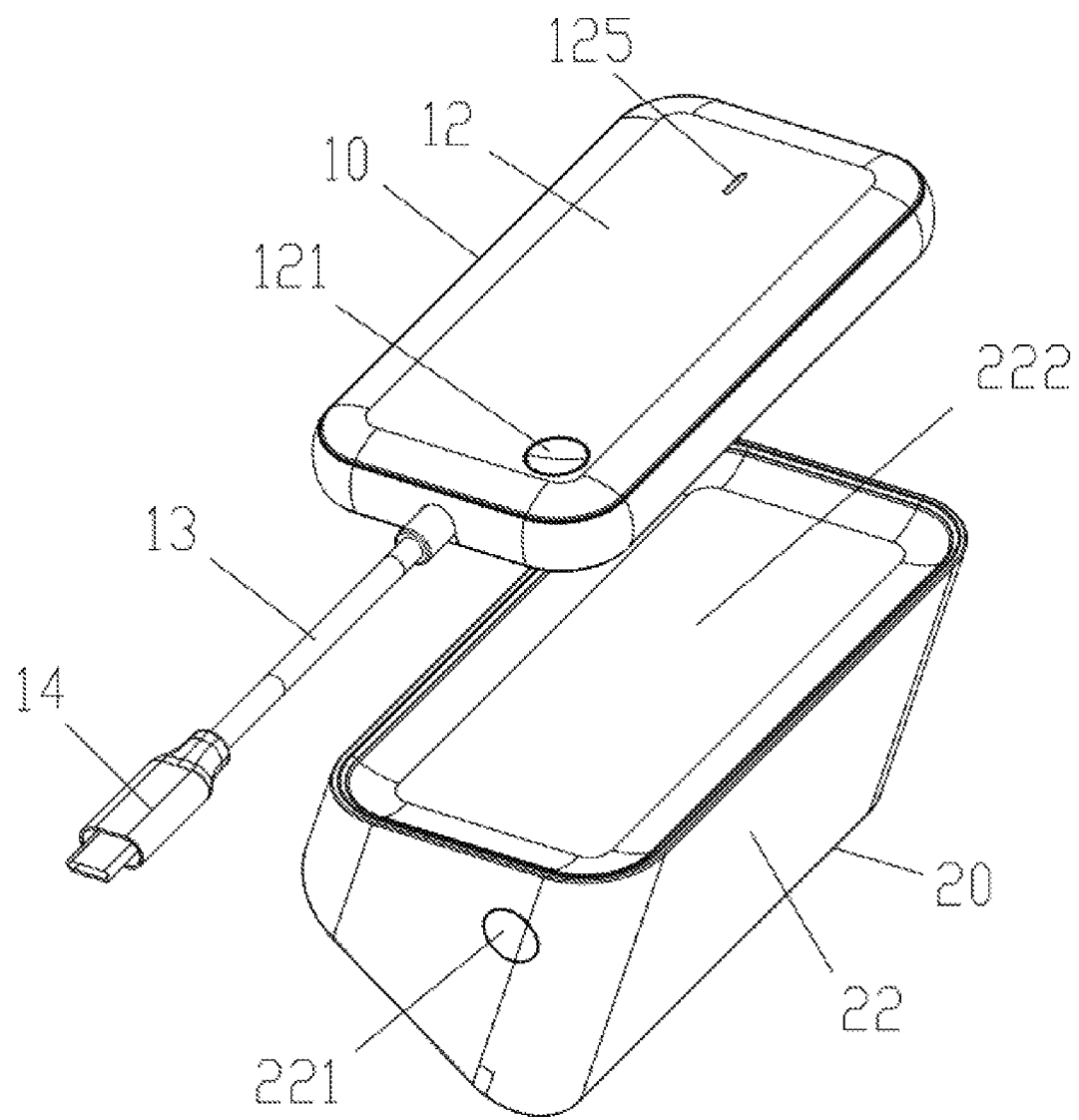
FIG. 2 is the isometric view of the hub of FIG. 1, showing that a first member is disengaged from the second member of the hub.
Figure 3:
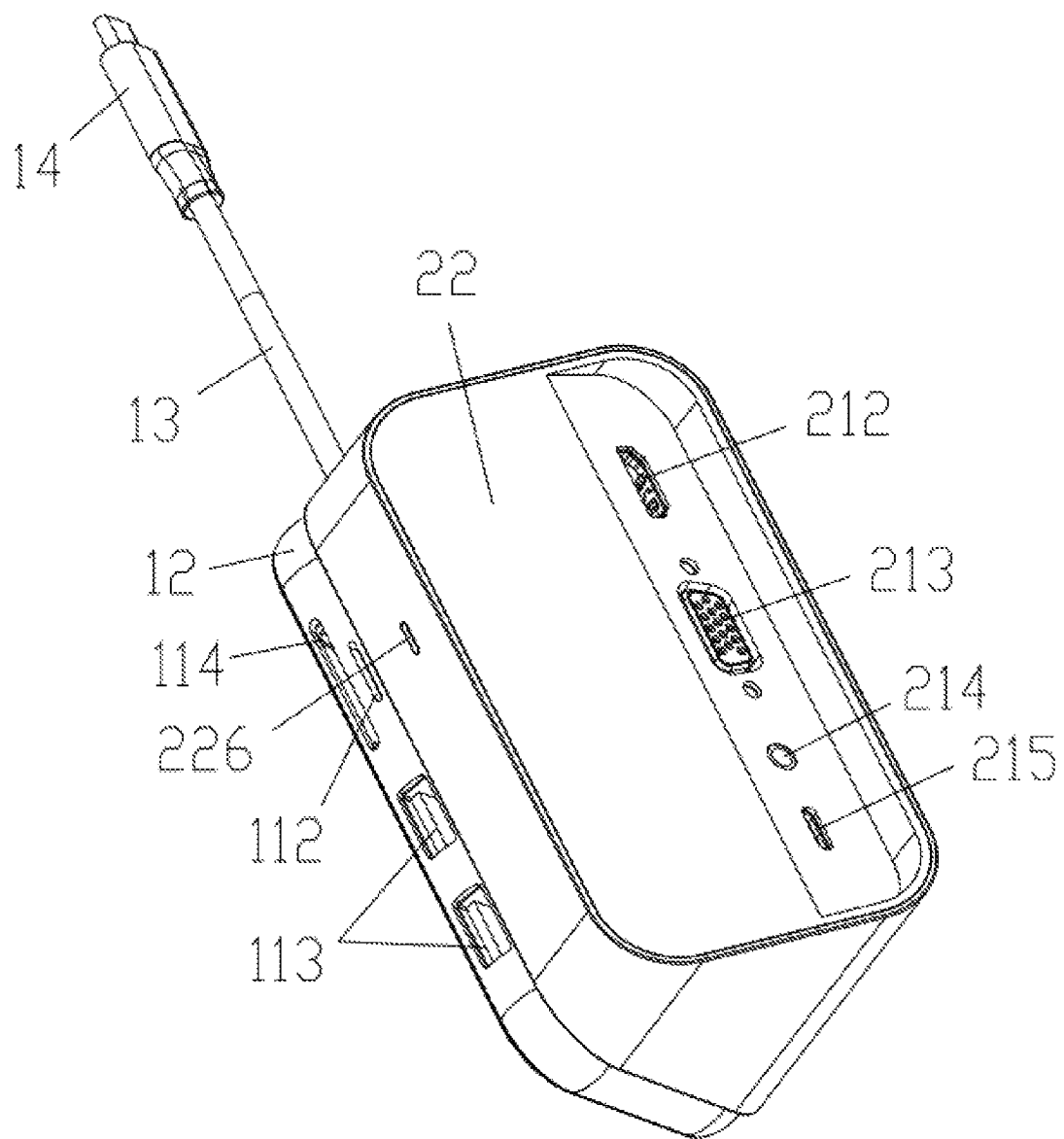
FIG. 3 is isometric view of the hub of FIG. 1, showing that the first member is connected to the second member of the hub.
Figure 4:
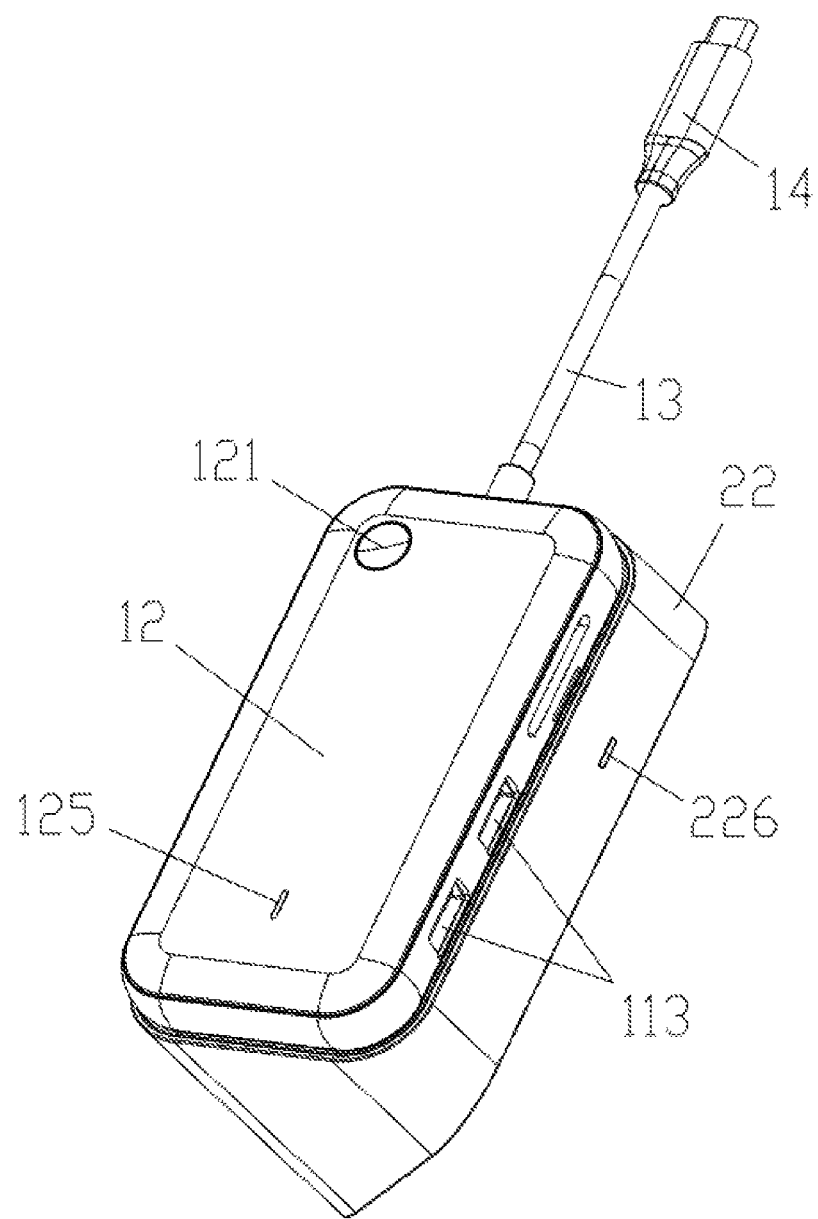
FIG. 4 is similar to FIG. 1, but viewed from a different perspective.

Referring to FIGS. 1-4, in one embodiment, a hub 100 includes a first member 10 and a second member 20. The first member includes a first housing 12 and a first circuit board 11 arranged within the first housing 12. The first circuit board 11 includes a wireless emitting module 111. The second member 20 is detachably connected to the first member 10 and includes a second housing 22 and a second circuit board 21 arranged within the second housing 22. The second circuit board 21 includes a wireless receiving module 211 that is able to wirelessly communicate with the wireless emitting module 111.

In one embodiment, the wireless emitting module 111 is an RV110G chip that is electrically connected to the first circuit board 11. The wireless receiving module 211 is a RK3036 chip that is electrically connected to the second circuit board 21. The wireless emitting module 111 and the wireless receiving module 211 uniquely correspond to each other, and they work on the 2.4 GHz band or the 5 GHz band and can wirelessly communicate with each other. During operation, the first member 10 is electrically connected to an electronic device (e.g., a computer), the second member 20 is electrically connected to a peripheral device (e.g., a display), and a wireless connection between the first member 10 and the second member 20 enables the electronic device to be wirelessly connected with the peripheral device, thereby enabling data transmission between the electronic device and the peripheral device. Since the first member 10 can be removed from the second member 20, they can be placed at different locations, which gives a user the flexibility to place the peripheral device and the electronic device as needed.

In one embodiment, the first housing 12 includes a first button 121 that is connected to the first circuit board 11 and used to receive a manual operation from a user to enable or disable the wireless emitting module 111.

In one embodiment, the second housing 22 includes a second button 221 that is connected to the second circuit board 21 and used to receive a manual operation from a user to enable or disable the wireless receiving module 211. When the wireless emitting module 111 and the wireless receiving module 211 are both enabled, they will be automatically paired to form a wireless connection.

In one embodiment, the first member 10 further includes a cable 13 and a plug 14. The cable 13 includes a first end 131 electrically connected to the first circuit board 11, and a second end 132 connected to the plug 14.

In one embodiment, the plug 14 is a USB type-C male connector. The cable 13 is electrically connected to the plug 14, and the cable is electrically connected to the first circuit board 11. When the plug 14 is inserted into a receptacle of the electronic device, the first member 10 is electrically connected to the electronic device.

In one embodiment, the first member 10 further includes a first connection member 15 arranged within the first housing 12. The second member 20 further includes a second connection member 23 arranged within the second housing 22. The second connection member 23 is can be magnetically connected to the first connection member 15, which allows the second member 20 to be detachably connected to the first member 10.

In the embodiment, the first connection member 15 can be firmly attracted to the second connection member 23, which allows the first member 10 and the second member 20 to be firmly connected to each other. The first member 10 and the second member 20 will not be separated without external force.

In one embodiment, the second housing 22 defines a recess 222 to receive the first housing 12 therein. With such arrangement, the first member 10 can steadily rest on the second member 20.

In the embodiment, the recess 222 restricts the movement of the first member 10 on the second member 20. When the first member 10 and the second member 20 are attracted to each other, the recess 222 provides more restriction to the first member 10.

In one embodiment, the first circuit board 11 further includes a transflash (TF) connector 112, a secure digital (SD) connector 114, and a universal serial bus (USB) female connector 113. The first housing 12 defines a first through hole 122 for the TF connector 112, a second through hole 123 for the SD connector 114, and a third through hole 124 for the USB female connector 113. These through holes allow corresponding connectors to be exposed so that they can connect with TF cards, SD cards, and USB male connectors. In the embodiment, the TF connector 112, the SD connector 114, and the USB female connector 113 are all fixedly connected to the first circuit board 11.

In one embodiment, the second circuit board 21 further includes a high definition multimedia interface (HDMI) connector 212, a video graphic array (VGA) connector 213, a headphone port 214, and a RISK universal serial bus (USB) type-C female connector 215. The second housing 22 defines a fourth through hole 223 for the HDMI connector 212, a fifth through hole 224 for the VGA connector 213, and a sixth through hole 225 for the USB type-C female connector 215. The external end of the headphone port 214 is flush with a surface of the second housing 22. These through holes allow corresponding connectors to be exposed so that they can connect with HDMI plugs, VGA plugs, and USB type-C male connectors. In the embodiment, the HDMI connector 212, the VGA connector 213, the headphone port 214, and the USB type-C female connector 215 are all fixedly connected to the second circuit board 21.

In one embodiment, the first member 10 further includes a first light emitting diode (LED) indicator 125 arranged within the first housing 12 and electrically connected to the first circuit board 11. The second member 20 further includes a second LED indicator 226 arranged within the second housing 22 and electrically connected to the second circuit board 21.

In the embodiment, when the wireless emitting module 111 is in a disabled state, the first LED indicator 125 does not emit light, and when the wireless receiving module 211 is in a disabled state, the second LED indicator 226 does not emit light. When the wireless emitting module 111 is enabled and the wireless emitting module 111 and the wireless receiving module 211 are not paired to create a wireless connection, the first LED indicator 125 emits red light. When the wireless receiving module 211 is enabled and the wireless emitting module 111 and the wireless receiving module 211 are not paired to create a wireless connection, the second LED indicator 226 emits red light. When the wireless emitting module 111 and the wireless receiving module 211 are paired to create a wireless connection, the first LED indicator 125 and the second LED indicator 226 both emit green light.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A hub comprising:
    a first member comprising a first housing and a first circuit board arranged within the first housing, the first circuit board comprising a wireless emitting module; the first housing comprises a first button on a top wall that is connected to the first circuit board and configured to receive an operation to enable or disable the wireless emitting module; and
    a second member detachably connected to the first member and comprising a second housing and a second circuit board arranged within the second housing, the second housing comprises a second button on one of the side walls that is connected to the second circuit board and configured to receive an operation to enable or disable the wireless receiving module; the second circuit board comprising a wireless receiving module that is configured to wirelessly communicate with the wireless emitting module and a plurality of interface connectors;
    wherein detachment of the first member from the second member or detachment of the second member from the first member causes the wireless emitting module to wirelessly communicate with the wireless receiving module; and
    the second housing comprising a front wall with a LED, a rear wall opposite to the front wall, a left and a right walls; a top wall comprising a first plane and a second plane, the first plane parallel to a plane formed by the front, rear, the side walls; the second plane extended from the first plane and inclined toward the rear wall and a bottom wall surrounded by the front, rear, left and right walls; the second plane comprising a plurality of through holes to recess the plurality of interface connectors respectively; and
    the second housing defining a recess in the bottom wall of the second housing, the recess having a bottom wall and side walls outwardly inclined toward the top wall, and wherein a bottom wall of a body of the first housing is contoured to fit in the recess in the bottom wall of the second housing, the bottom wall of the recess inclined from the rear wall to the front wall so that the top wall of the first housing opposite to the bottom wall facing a direction toward the LED.

2. The hub according to claim 1, wherein the first member further comprises a cable and a plug, the cable comprises a first end electrically connected to the first circuit board, and a second end connected to the plug.

3. The hub according to claim 1, wherein the first member further comprises a first connection member arranged within the first housing.

4. The hub according to claim 3, wherein the second member further comprises a second connection member arranged within the second housing, the second connection member is configured to be magnetically connected to the first connection member so as to detachably connect the second member to the first member.

5. The hub according to claim 1, wherein the first circuit board further comprises a transflash (TF) connector, a secure digital (SD) connector, and a universal serial bus (USB) female connector, and the first housing defines a first through hole for the TF connector, a second through hole for the SD connector, and a third through hole for the USB female connector.

6. The hub according to claim 1, wherein the second circuit board further comprises a high definition multimedia interface (HDMI) connector, a video graphic array (VGA) connector, a headphone port, and a universal serial bus (USB) type-C female connector, the second housing defines a fourth through hole for the HDMI connector, a fifth through hole for the VGA connector, and a sixth through hole for the USB type-C female connector.

7. The hub according to claim 1, wherein the first member comprises a first light emitting diode (LED) indicator arranged within the first housing and electrically connected to the first circuit board.

8. The hub according to claim 1, wherein the wireless emitting module is a RV110G chip that is electrically connected to the first circuit board.

9. The hub according to claim 1, wherein the wireless receiving module is a RK3036 chip that is electrically connected to the second circuit board.

10. A hub comprising:
a first member configured to be electrically connected to an electronic device, comprising a first housing and a first circuit board arranged within the first housing, the first circuit board comprising a wireless emitting module; the first housing comprises a first button on a top wall that is connected to the first circuit board and configured to receive an operation to enable or disable the wireless emitting module; and
a second member configured to be electrically connected to a peripheral device, the second member being magnetically and detachably connected to the first member and comprising a second housing and a second circuit board arranged within the second housing, the second circuit board comprising a wireless receiving module that is configured to wirelessly communicate with the wireless emitting module; the second housing comprises a second button on one of the side walls that is connected to the second circuit board and configured to receive an operation to enable or disable the wireless receiving module;
wherein detachment of the first member from the second member or detachment of the second member from the first member causes the wireless emitting module to wirelessly communicate with the wireless receiving module; and wherein the first circuit board and the second board are arranged at approximately a right angle relative to each other when the first member is magnetically connected to the second member; and the second housing comprising a front wall with a LED, a rear wall opposite to the front wall, a left and a right walls; a top wall comprising a first plane and a second plane, the first plane parallel to a plane formed by the front, rear, the side walls; the second plane extended from the first plane and inclined toward the rear wall and a bottom wall surrounded by the front, rear, left and right walls; the second plane comprising a plurality of through holes to recess the plurality of interface connectors respectively; and the second housing defining a recess in the bottom wall of the second housing, the recess having a bottom wall and side walls outwardly inclined toward the top wall, and wherein a bottom wall of a body of the first housing is contoured to fit in the recess in the bottom wall of the second housing, the bottom wall of the recess inclined from the rear wall to the front wall so that the top wall of the first housing opposite to the bottom wall facing a direction toward the LED.

11. The hub according to claim 10, wherein the first member further comprises a cable and a plug, the cable comprises a first end electrically connected to the first circuit board, and a second end connected to the plug.

12. The hub according to claim 11, wherein the plug is configured to be inserted into a receptacle of the electronic device to electrically connect the first member to the electronic device.

13. The hub according to claim 10, wherein the first member further comprises a first connection member arranged within the first housing.

14. The hub according to claim 13, wherein the second member further comprises a second connection member arranged within the second housing, the second connection member is configured to be magnetically connected to the first connection member so as to detachably connect the second member to the first member.

* * * * *